(12) United States Patent
Kim et al.

(10) Patent No.: US 7,944,278 B2
(45) Date of Patent: May 17, 2011

(54) CIRCUIT FOR GENERATING NEGATIVE VOLTAGE AND SEMICONDUCTOR MEMORY APPARATUS USING THE SAME

(75) Inventors: Yeon-Uk Kim, Ichon (KR); Young-Do Hur, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/343,329

(22) Filed: Dec. 23, 2008

(65) Prior Publication Data

US 2010/0019810 A1    Jan. 28, 2010

(30) Foreign Application Priority Data

Jul. 28, 2008 (KR) .................. 10-2008-0073610

(51) Int. Cl.
*G05F 1/10* (2006.01)
*G05F 3/02* (2006.01)
(52) U.S. Cl. ........... 327/536; 327/535; 327/537; 363/60
(58) Field of Classification Search .................. 327/148, 327/157, 534–537; 363/59, 60
See application file for complete search history.

(56) References Cited

U.S. PATENT DOCUMENTS

| 6,356,499 B1 | 3/2002 | Banba et al. |
| 6,741,118 B2 | 5/2004 | Uchikoba et al. |
| 2006/0140018 A1* | 6/2006 | Do .......................... 365/189.09 |

FOREIGN PATENT DOCUMENTS

| JP | 11-312392 | 11/1999 |
| JP | 2003-168293 | 6/2003 |
| KR | 1019980011434 A | 4/1998 |
| KR | 1020000031190 A | 6/2000 |

* cited by examiner

*Primary Examiner* — Lincoln Donovan
*Assistant Examiner* — Brandon S Cole
(74) *Attorney, Agent, or Firm* — Baker & McKenzie LLP

(57) ABSTRACT

A circuit for generating negative voltage of a semiconductor memory apparatus includes a first detecting unit configured to generate a first detecting signal by detecting a first negative voltage level, a first negative voltage generating unit configured to generate the first negative voltage in response to the first detecting signal, a second detecting unit configured to generate a second detecting signal by detecting the second negative voltage level, a timing controlling unit configured to output the second detecting signal as an enable signal when a power up signal is enabled and the first detecting signal is disabled, and a second negative voltage generating unit configured to generate the second negative voltage in response to the enable signal.

19 Claims, 5 Drawing Sheets

US 7,944,278 B2

CIRCUIT FOR GENERATING NEGATIVE VOLTAGE AND SEMICONDUCTOR MEMORY APPARATUS USING THE SAME

CROSS-REFERENCES TO RELATED PATENT APPLICATION

This application claims the benefit of Korean Patent Application No. 10-2008-0073610, filed on Jul. 28, 2008, in the Korean Intellectual Property Office, which is incorporated herein by reference in its entirety as set forth in full.

BACKGROUND

1. Technical Field

The embodiments described here relate to a semiconductor memory apparatus, and more particularly, to a circuit for generating negative voltage in a semiconductor memory apparatus.

2. Related Art

In general, a semiconductor memory apparatus is constituted by transistors. In particular, a transistor included in a memory cell can supply a first negative voltage to a bulk of a transistor to reduce leakage current. Further, the transistor can supply a second negative voltage to a source terminal of the transistor to compensate for an increase in a threshold voltage caused by the first negative voltage supplied to the bulk of the transistor. Here, an absolute value of the first negative voltage level supplied to the bulk of the transistor should always be higher than that of the second negative voltage level in order to prevent the latch-up phenomenon, which damages transistor elements when a voltage level supplied to the bulk of the transistor is higher than a voltage level applied to the source of the transistor.

FIG. 1 is a schematic diagram of a conventional circuit for generating negative voltage of a semiconductor memory apparatus, and FIG. 2 is a timing diagram of a conventional circuit for generating negative voltage. In FIG. 1, the circuit 1 includes a first negative voltage generating unit 40 and a second negative voltage generating unit 80.

The first negative voltage generating unit 40 includes a first detecting unit 10, a first oscillator 20, and a first charge pump 30. The first detecting unit 10 detects a first negative voltage VNN1 level and generates a first detecting signal 'det1', and the first oscillator 20 generates a first oscillator signal 'OSC1' in response to the first detecting signal 'det1'. The first charge pump 30 performs a pumping operation in response to the first oscillator signal 'OSC1'. Here, the first charge pump 30, which performs the pumping operation, generates the first negative voltage VNN1.

The second negative voltage generator 80 includes a second detecting unit 50, a second oscillator 60, and a second charge pump 70. The second detecting unit 50 detects a second negative voltage VNN2 level and generates a second detecting signal 'det2', and the second oscillator 60 generates a second oscillator signal 'OSC2' in response to the second detecting signal 'det2'.

The second charge pump 70 performs a pumping operation in response to the second oscillator signal 'OSC2', and the second charge pump 70, which performs the pumping operation, generates a second negative voltage VNN2. Here, the first negative voltage VNN1 is voltage supplied to the bulk of the transistor used in all circuits in the semiconductor memory apparatus and the second negative voltage VNN2 is a voltage supplied to the source of the transistor used in specific circuits in the semiconductor memory apparatus. Thus, capacitance of a node supplied with the first negative voltage VNN1 is larger than capacitance of a node applied with the second negative voltage VNN2. Furthermore, the second negative voltage VNN2 reaches a target level earlier than when the first negative voltage VNN1 reaches the target level.

As a result, when the second negative voltage generating unit 80 starts to generate the second negative voltage VNN2 before the first negative voltage VNN1 generated by the first negative voltage generating unit 40 reaches the target level, a reversal phenomenon (a phenomenon where the second negative voltage VNN2 level becomes lower than the first negative voltage VNN1 level) can occur as in "A" in FIG. 2. The latch-up phenomenon, which can damage the transistor, can occur due to the reversal phenomenon. Damage to the transistor can reduce stability and operational reliability of the semiconductor memory apparatus.

SUMMARY

A circuit for generating negative voltage of a semiconductor memory apparatus capable of generating a second negative voltage supplied to a source of a transistor after a first negative voltage supplied to a bulk of a transistor reaches a target level is described herein.

In one aspect, a circuit for generating negative voltage of a semiconductor memory apparatus includes a first detecting unit configured to generate a first detecting signal by detecting a first negative voltage level, a first negative voltage generating unit configured to generate the first negative voltage in response to the first detecting signal, a second detecting unit configured to generate a second detecting signal by detecting the second negative voltage level, a timing controlling unit configured to output the second detecting signal as an enable signal when a power up signal is enabled and the first detecting signal is disabled, and a second negative voltage generating unit configured to generate the second negative voltage in response to the enable signal.

In another aspect, a semiconductor memory apparatus comprises first and second internal voltage generating units configured to generate a first internal voltage level and a second internal voltage level in response to a first detecting signal and a second detecting signal, respectively, wherein the second internal voltage generating unit includes a control signal generating unit configured to generate the second internal voltage in response to the second detecting signal when a control signal is enabled and to enable the control signal when the first detecting signal is disabled.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
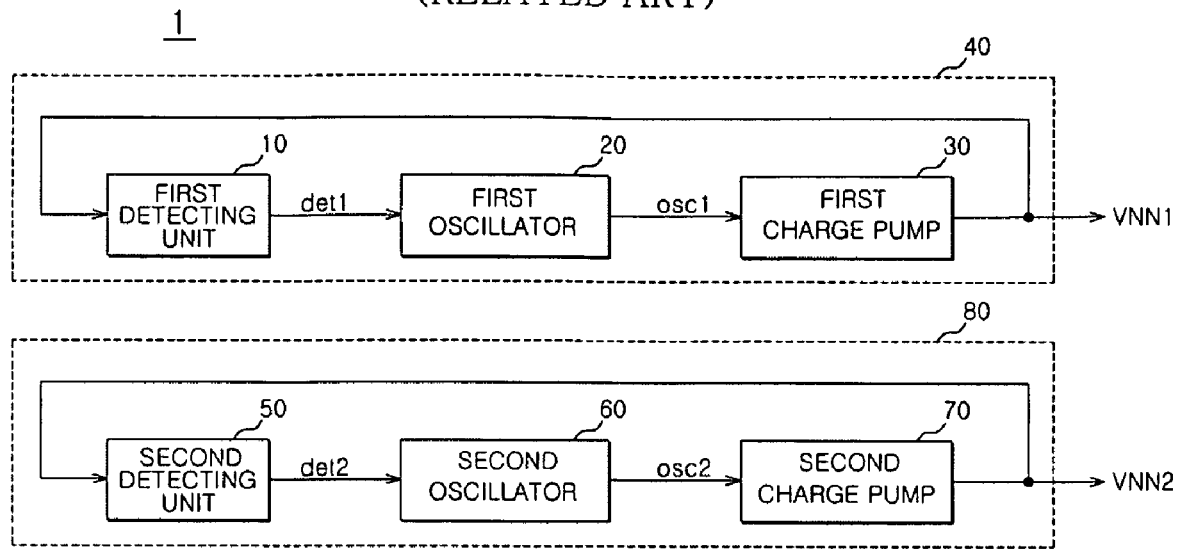
FIG. 1 is a schematic diagram of a conventional circuit for generating negative voltage of a semiconductor memory apparatus.
Figure 2:
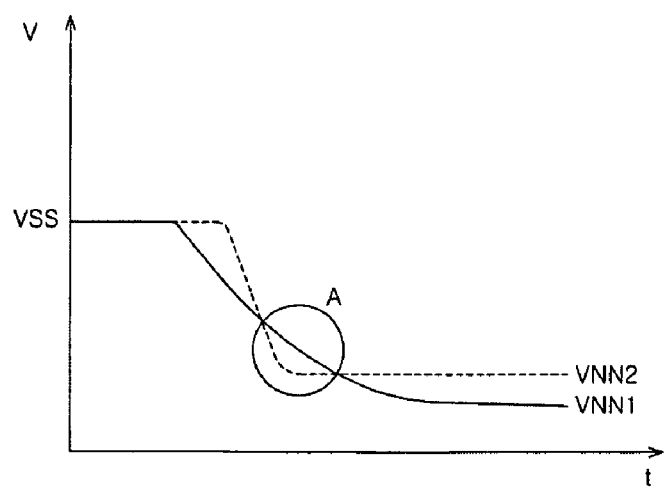
FIG. 2 is a timing diagram of a conventional circuit for generating negative voltage.
Figure 3:
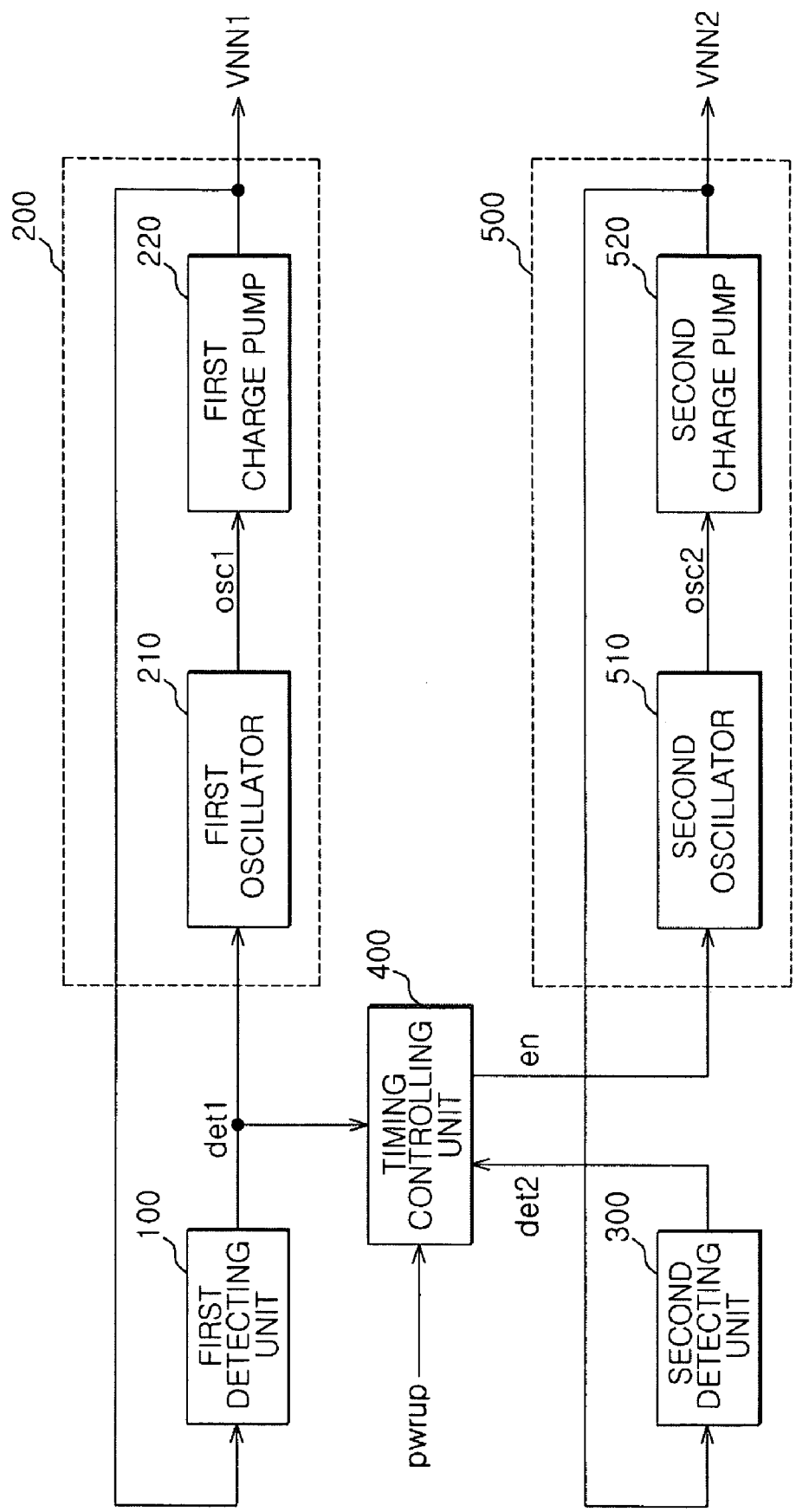
FIG. 3 is a schematic diagram of an exemplary circuit for generating negative voltage according to one embodiment.

FIG. 3 is a schematic diagram of an exemplary circuit 2 for generating negative voltage according to one embodiment. In FIG. 3, the circuit 2 for generating negative voltage of a semiconductor memory apparatus can be configured to include a first detecting unit 100, a first negative generating unit 200, a second detecting unit 300, a timing controlling unit 400, and a second negative voltage generating unit 500.

The first detecting unit 100 can detect a first negative voltage VNN1 level and can generate a first detecting signal 'det1'. For example, the first detecting unit 100 can enable the first detecting signal 'det1' when the first negative voltage VNN1 level is higher than the first target level. Here, the target level denotes a desired voltage level of a circuit for generating voltage.

The first negative voltage generating unit 200 can generate the first negative voltage VNN1 in response to the first detecting signal 'det1'. For example, the first negative voltage generating unit 200 can include a first oscillator 210 and a first charge pump 220. The first oscillator 210 can generate a first oscillator signal 'osc1' when the first detecting signal 'det1' is enabled. In addition, the first charge pump 220 can perform a pumping operation in response to the first oscillator signal 'osc1'. For example, the first charge pump 220 can perform the pumping operation and can generate the first negative voltage VNN1.

The second detecting unit 300 can detect a second negative voltage VNN2 level and can generate a second detecting signal 'det2'. For example, the second detecting unit 300 can generate the second detecting signal 'det2' when the second negative voltage VNN2 level is higher than a second target level.

The timing controlling unit 400 can output the second detecting signal 'det2' as an enable signal 'en' when the power up signal 'pwrup' is enabled and the first detecting signal 'det1' is disabled.

The second negative voltage generating unit 500 can generate the second negative voltage VNN2 in response to the enable signal 'en'. For example, the second negative voltage generating unit 500 can include a second oscillator 510 and a second charge pump 520. The second oscillator 510 can generate a second oscillator signal 'osc2' when the second detecting signal 'det2' is enabled, and the second charge pump 520 can perform the pumping operation in response to the second oscillator signal 'osc2'. The second charge pump 520 can perform the pumping operation and can generate the second negative voltage VNN2. Here, the first target level of the first negative voltage VNN1 can be lower than the second target level of the second negative voltage VNN2.

Figure 4:
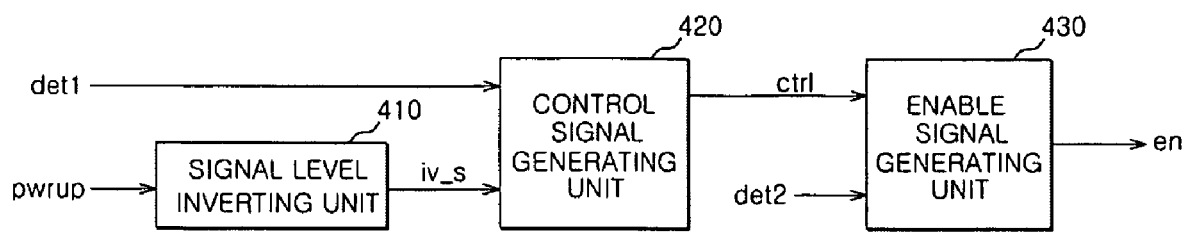
FIG. 4 is a schematic diagram of an exemplary timing controlling unit capable of being implemented in the circuit of FIG. 3 according to one embodiment.

FIG. 4 is a schematic diagram of an exemplary timing controlling unit 400 capable of being implemented in the circuit of FIG. 3 according to one embodiment. In FIG. 4, the timing controlling unit 400 can include a signal level inverting unit 410, a control signal generating unit 420, and an enable signal generating unit 430 as shown in FIG. 4.

The signal level inverting unit 410 can invert the power up signal 'pwrup' and can generate the inverted signal 'iv_s'. In addition, the control signal generating unit 420 can enable a control signal 'ctrl' when the inverted signal 'iv_s' is enabled and the first detecting signal 'det1' is disabled. Moreover, the control signal generating unit 420 can maintain the control signal 'ctrl' at an enabled state regardless of the first detecting signal 'det1' even when the control signal 'ctrl' is enabled only once. Furthermore, the enable signal generating unit 430 can output the second detecting signal 'det2' as the enable signal 'en' when the control signal 'ctrl' is enabled.

Figure 5:
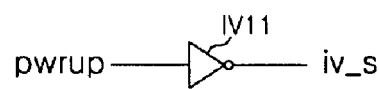
FIG. 5 is a schematic diagram of an exemplary signal level inverting unit capable of being implemented in the unit of FIG. 4 according to one embodiment.

FIG. 5 is a schematic diagram of an exemplary signal level inverting unit 410 capable of being implemented in the unit of FIG. 4 according to one embodiment. In FIG. 5, the signal level inverting unit 410 can be implemented by one inverter IV11.

Figure 6:
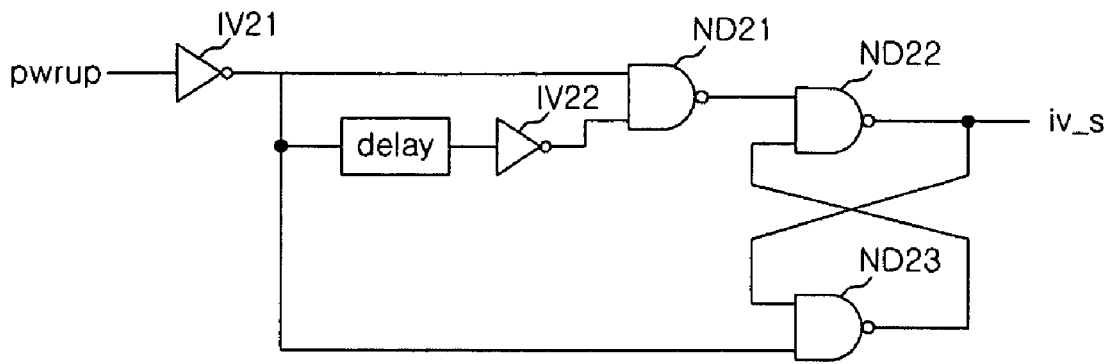
FIG. 6 is a schematic diagram of another exemplary signal level inverting unit capable of being implemented in the unit of FIG. 4 according to another embodiment.

FIG. 6 is a schematic diagram of another exemplary signal level inverting unit 410 capable of being implemented in the unit of FIG. 4 according to another embodiment. In FIG. 6, the signal level inverting unit 410 can include first and second inverters IV21 and IV22, first, second, and third NAND gates ND21, ND22, and ND23, and a delay "delay." The first inverter IV21 can receive the power up signal 'pwrup', the delay "delay" can receive an output signal of the first inverter IV21, and the second inverter IV22 can receive an output signal of the delay "delay."

In FIG. 6, the first NAND gate ND21 can receive the output signal of the first inverter IV21 and the output signal of the second inverter IV22, and the second NAND gate ND22 can receive an output signal of the first NAND gate ND21. In addition, the third NAND gate ND23 can receive an output signal of the second NAND gate ND22 and the output signal of the first inverter IV21, and can output the output signals to the second NAND gate ND22. Here, the second NAND gate ND22 can output the inverted signal 'iv_s'.

An exemplary operation of the signal level inverting unit 410 will be described with reference to FIG. 6.

In FIG. 6, the first NAND gate ND21 can output a pulse enabled for a predetermined time when the power up signal 'pwrup' is enabled at a low level. Here, a flip-flop configured of the second NAND gate ND22 and the third NAND gate ND23 can transition the inverted signal 'iv_s' to a high level when the pulse is disabled to a high level followed by a transitioning to a low level. In addition, the flip-flop can maintain the inverted signal 'iv_s' at a high level state while the power up signal 'pwrup' maintains an enable state at a low level. For example, the inverted signal 'iv_s' can be disabled at a low level in a state where the power up signal 'pwrup' is disabled at a high level, and can maintain an enabled state at a high level when the power up signal 'pwrup' is enabled at a low level.

Figure 7:
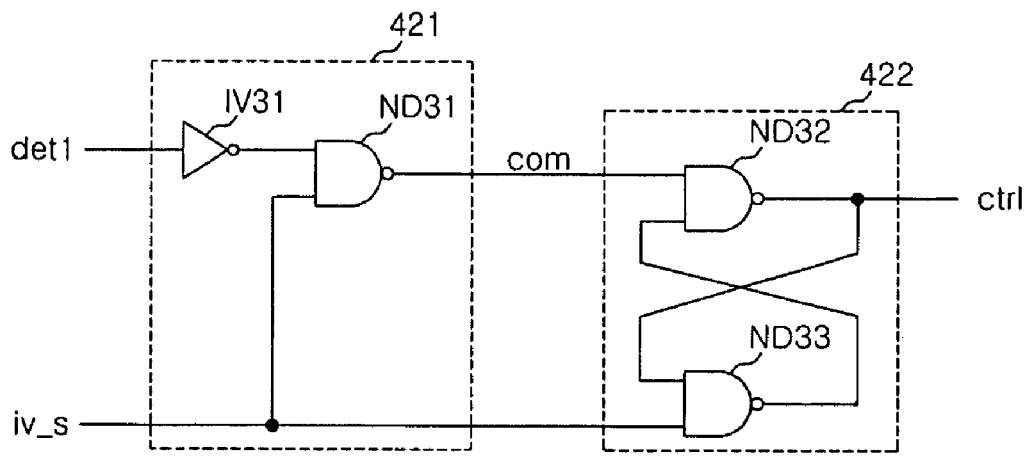
FIG. 7 is a schematic diagram of an exemplary control signal generating unit capable of being implemented in the unit of FIG. 4 according to one embodiment.

FIG. 7 is a schematic diagram of an exemplary control signal generating unit 420 capable of being implemented in the unit of FIG. 4 according to one embodiment. In FIG. 7, the control signal generating unit 420 can include a signal combination unit 421 and a flip-flop 422.

The signal combination unit 421 can enable a combination signal 'com' at a high level when the inverted signal 'iv_s' is enabled at a high level and the first detecting signal 'det1' is disabled at a low level. For example, the signal combination unit 421 can include a third inverter IV31 and a fourth NAND gate ND31. The third inverter IV31 can receive the first detecting signal 'det1', and the fourth NAND gate ND31 can receive an output signal of the third inverter IV31 and the first detecting signal 'det1', and can output the combination signal 'com'.

In FIG. 7, the flip-flop 422 can invert the level of the combination signal 'com' and can output the inverted level as the level of the control signal 'ctrl' while the inverted signal 'iv_s' is disabled at a low level. Meanwhile, the flip-flop 422 can enable the control signal 'ctrl' at a high level when the inverted signal 'iv_s' is enabled at a high level, and can maintain the enabled control signal 'ctrl' at the high level while the inverted signal 'iv_s' is enabled at a high level. For example, the flip-flop 422 can maintain the level of the enabled control signal 'ctrl' in a state where the inverted signal 'iv_s' is enabled at a high level.

For example, the flip-flop 422 can include fifth and sixth NAND gates ND32 and ND33. Accordingly, the fifth NAND gate ND32 can receive the combination signal 'com' and an output signal of the sixth NAND gate ND33, and can output the control signal 'ctrl'. The sixth NAND gate ND33 can receive the control signal 'ctrl' and the inverted signal 'iv_s', and can output the output signal to the fifth NAND gate ND32.

Figure 8:
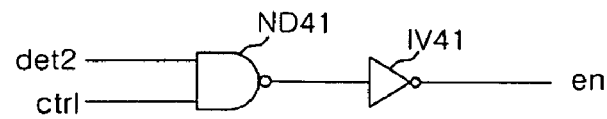
FIG. 8 is a schematic diagram of an exemplary enable signal generating unit capable of being implemented in the unit of FIG. 4 according to one embodiment.

FIG. 8 is a schematic diagram of an exemplary enable signal generating unit 430 capable of being implemented in the unit of FIG. 4 according to one embodiment. In FIG. 8, the enable signal generating unit 430 can include a seventh NAND gate ND41 and a fourth inverter IV41. The seventh NAND gate ND41 can receive the second detecting signal 'det2' and the control signal 'ctrl' and the fourth inverter IV41 can receive the seventh NAND gate ND41, and can output the enable signal 'en'.

Figure 9:
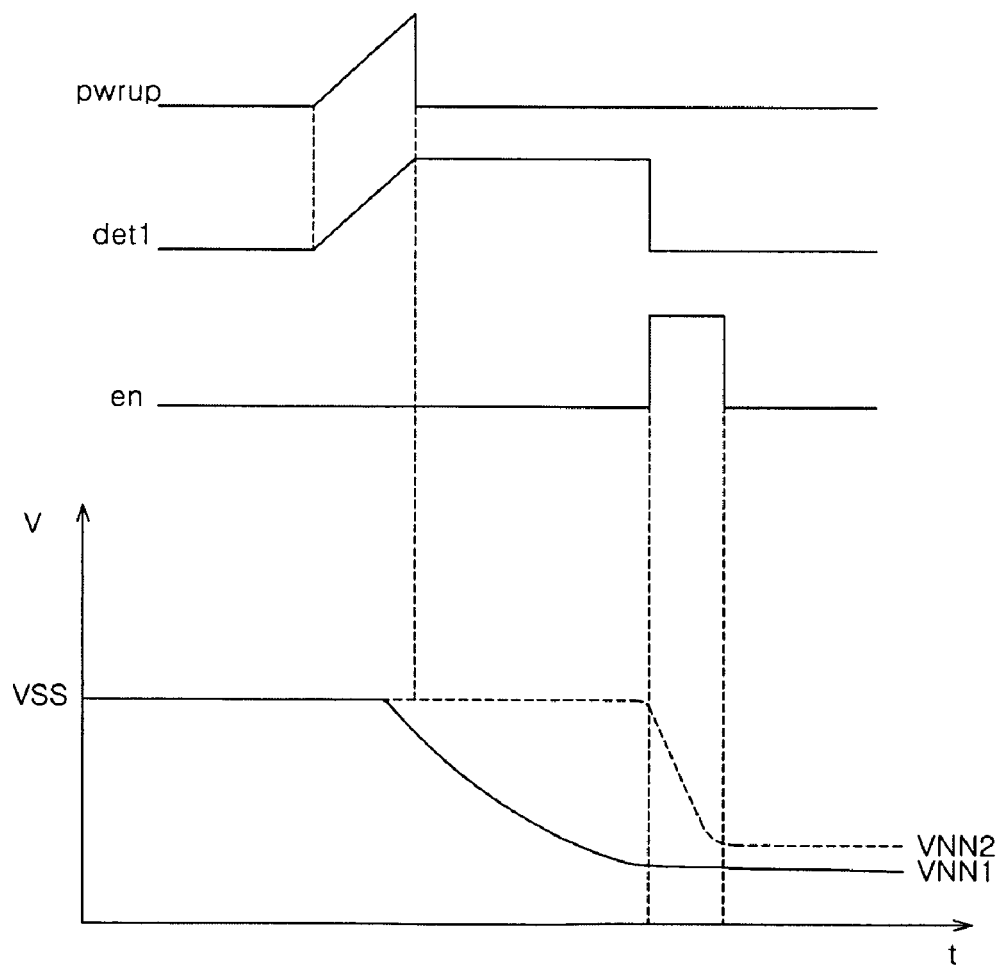
FIG. 9 is a timing diagram of an exemplary circuit for generating negative voltage of a semiconductor memory apparatus according to one embodiment.

FIG. 9 is a timing diagram of the exemplary 2 circuit for generating negative voltage of a semiconductor memory apparatus according to one embodiment. An exemplary operation of the circuit 2 for generating negative voltage of a semiconductor memory apparatus will be described with reference to FIG. 9.

In FIG. 9, when external voltage is supplied to the semiconductor memory apparatus, the voltage level of the power up signal 'pwrup' starts to rise. In addition, the voltage level of the first detecting signal 'det1' starts to rise, corresponding to the rise of the voltage level of the power up signal 'pwrup'. Here, even after the power up signal 'pwrup' is disabled at a low level, the first negative voltage VNN1 does not reach the first target level. Thus, the first detecting signal 'det1' can maintain the enabled signal 'en' at a high level.

When the first negative voltage VNN1 reaches the first target level, the first detecting signal 'det1' can be disabled at a low level. The enable signal 'en' is disabled at a low level regardless of the level of the second detecting signal 'det2' in a state where the first detecting signal 'det1' is an enabled state at a high level. For example, even though the second detecting signal 'det2' can be enabled at a high level in the state where the first detecting signal 'det1' is enabled at a high level, since the control signal 'ctrl' is disabled at a low level, the enable signal 'en' can be disabled at a low level. However, if the first detecting signal 'det1' is disabled at a low level, since the control signal 'ctrl' is enabled at a high level, then the second detecting signal 'det2' can be output as the enable signal 'en'.

Thus, when the first detecting signal 'det1' is transitioned from a high level to a low level, the enable signal 'en' can be enabled at a high level. Accordingly, the enable signal 'en' is enabled at a high level, such that the second negative voltage VNN2 is generated If the second negative voltage VNN2 reaches the second target level, then the second detecting signal 'det2' can be disabled at a low level. Accordingly, the enable signal 'en' can be disabled at a low level when the second detecting signal 'det2' is disabled at a low level.

Since the second negative voltage VNN2 is generated after the level of the first negative voltage VNN1 reaches the target level, the reversal phenomenon where the second negative voltage VNN2 level becomes lower than the first negative voltage VNN1 level does not occur. As a result, the latch-up phenomenon does not occur in the transistors configuring the semiconductor memory apparatus and thus, the phenomenon of damaging the transistors does not occur. As a result, the operation reliability of the semiconductor memory apparatus is increased.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A circuit for generating negative voltage of a semiconductor memory apparatus, comprising:
   a first detecting unit configured to generate a first detecting signal by detecting a first negative voltage level;
   a first negative voltage generating unit configured to generate the first negative voltage when the first detecting signal is enabled, and stop generating the first negative voltage when the first detecting signal is disabled;
   a second detecting unit configured to generate a second detecting signal by detecting a second negative voltage level;
   a timing controlling unit configured to output the second detecting signal as an enable signal when a power up signal is enabled and the first detecting signal is disabled, and maintain the enable signal at a disabled state until the first detecting signal is disabled after the power up signal is enabled; and
   a second negative voltage generating unit configured to generate a second negative voltage in response to the enable signal when the first detecting signal is disabled after the power up signal is enabled, and stop generating the second negative voltage regardless of the second detecting signal until the first detecting signal is disabled after the power up signal is enabled.

2. The circuit of claim 1, wherein a first target level associated with the first negative voltage is lower than a second target level associated with the second negative voltage.

3. The circuit of claim 2, wherein the first detecting unit enables the first detecting signal when the first negative voltage level is higher than the first target level.

4. The circuit of claim 3, wherein the second detecting unit enables the second detecting signal when the second negative voltage level is higher than the second target level.

5. The circuit of claim 4, wherein the timing controlling unit includes:
   a control signal generating unit configured to enable a control signal when the power up signal is enabled and the first detecting signal is disabled; and
   an enable signal generating unit configured to output the second detecting signal as the enable signal when the control signal is enabled.

6. The circuit of claim 5, wherein the control signal generating unit maintains the control signal at an enable state regardless of the first detecting signal when the control signal is enable.

7. The circuit of claim 6, wherein the control signal generating unit includes:
a signal combination unit configured to enable a combination signal when the power up signal is enabled and the first detecting signal is disabled; and
a flip-flop configured to enable the control signal when the power up signal is enabled and the combination signal is enabled.

8. The circuit of claim 7, wherein the signal combination unit disables the combination signal when the power up signal is disabled.

9. The circuit of claim 7, wherein the flip-flop maintains the enable state of the control signal until the power up signal is disabled when the control signal is enabled.

10. The circuit of claim 5, wherein the enable signal generating unit disables the enable signal when the control signal is disabled.

11. The circuit of claim 2, wherein the first negative voltage generating unit includes:
an oscillator configured to generate an oscillator signal when the first detecting signal is enabled; and
a charge pump configured to generate the first negative voltage by performing a pumping operation in response to the oscillator signal.

12. A semiconductor memory apparatus, comprising:
first and second internal voltage generating units configured to generate a first internal voltage level and a second internal voltage level in response to a first detecting signal and a second detecting signal, respectively,
wherein the first internal voltage generating unit is configured to generate the first internal voltage when the first detecting signal is enabled and stop generating the first internal voltage when the first detecting signal is disabled, and
wherein the second internal voltage generating unit includes a control signal generating unit configured to generate the second internal voltage in response to the second detecting signal regardless of the first detecting signal when a control signal is enabled, stop generating the second internal voltage regardless of the second detecting signal when the control signal is disabled, and the control signal generating unit is configured to enable the control signal when the first detecting signal is disabled, the control signal being maintained at an enabled state by the control signal generating unit after the control signal is enabled.

13. The semiconductor memory apparatus of claim 12, further comprising
a first detecting unit configured to generate the first detecting signal by detecting a first internal voltage level.

14. The semiconductor memory apparatus of claim 13, further comprising a second detecting unit configured to generate the second detecting signal by a second internal voltage level.

15. The semiconductor memory apparatus of claim 14, wherein a first target level associated with the first negative voltage is lower than a second target level associated with the second negative voltage.

16. The semiconductor memory apparatus of claim 15, wherein the first detecting unit enables the first detecting signal when the first negative voltage level is higher than the first target level.

17. The semiconductor memory apparatus of claim 16, wherein the second detecting unit enables the second detecting signal when the second negative voltage level is higher than the second target level.

18. The semiconductor memory apparatus of claim 12, wherein the first voltage generating unit is configured to generate the first internal voltage when the first detecting signal is enabled.

19. The semiconductor memory apparatus of claim 12, wherein the control signal generating unit is configured to generate the control signal in response to the first detecting signal when the power up signal is disabled, and enable the control signal and maintain the enabled control signal when the power up signal is enabled and the first detecting signal is disabled.

* * * * *